(12) United States Patent
Jin et al.

(10) Patent No.: US 11,817,019 B2
(45) Date of Patent: Nov. 14, 2023

(54) DISPLAY DEVICE

(71) Applicant: Samsung Display Co., Ltd., Yongin-si (KR)

(72) Inventors: Jeong Oh Jin, Yongin-si (KR); Cheol Hwan Eom, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 184 days.

(21) Appl. No.: 16/928,981

(22) Filed: Jul. 14, 2020

(65) Prior Publication Data
US 2021/0118336 A1   Apr. 22, 2021

(30) Foreign Application Priority Data

Oct. 18, 2019   (KR) ........................ 10-2019-0130217

(51) Int. Cl.
| | | |
|---|---|---|
| *G09F 9/30* | (2006.01) | |
| *H05K 1/02* | (2006.01) | |
| *H10K 50/84* | (2023.01) | |

(52) U.S. Cl.
CPC ............. *G09F 9/301* (2013.01); *H05K 1/028* (2013.01); *H10K 50/84* (2023.02); *H05K 2201/10128* (2013.01)

(58) Field of Classification Search
None
See application file for complete search history.

(56) References Cited

U.S. PATENT DOCUMENTS

| | | | | |
|---|---|---|---|---|
| 10,170,505 B2 * | 1/2019 | Lee | ...................... | H01L 27/1262 |
| 10,212,811 B1 | 2/2019 | Zhang et al. | | |
| 10,522,785 B2 | 12/2019 | Kim et al. | | |
| 2017/0263887 A1 | 9/2017 | Han et al. | | |
| 2017/0358772 A1 * | 12/2017 | Sung | .................... | H01L 27/3258 |
| 2018/0047938 A1 * | 2/2018 | Kishimoto | ............ | H01L 27/323 |
| 2018/0124937 A1 * | 5/2018 | Choi | ...................... | G06F 1/1652 |
| 2019/0033493 A1 | 1/2019 | Kwon et al. | | |
| 2019/0082528 A1 * | 3/2019 | Zhang | .................... | H05K 1/028 |

FOREIGN PATENT DOCUMENTS

| | | | | | |
|---|---|---|---|---|---|
| CN | | 109671753 A | * | 4/2019 | ......... H01L 27/3251 |
| KR | | 10-1844432 B1 | | 4/2018 | |
| KR | 10-2018-0066378 A | | | 6/2018 | |

* cited by examiner

*Primary Examiner* — Anthony J Frost
(74) *Attorney, Agent, or Firm* — Lewis Roca Rothgerber Christie LLP

(57) ABSTRACT

A display device including a substrate including first and second flat regions spaced apart from each other, and a bendable region between the first and second flat regions, a display layer on a first surface of the substrate in the first flat region, a first passivation layer on the first surface of the substrate in the bendable region, a second passivation layer on a second surface of the substrate, the second passivation layer defining cavities spaced apart from each other in the bendable region, and support members on the second surface of the substrate in the first flat region and the second flat region, wherein a first density of the cavities corresponding to a first area in the bendable region is less than an average density of the cavities, and wherein a first bending stress of the substrate at the first area is greater than an average bending stress of the substrate in the bendable region.

13 Claims, 12 Drawing Sheets

DISPLAY DEVICE

CROSS-REFERENCE TO RELATED APPLICATION

This application claims priority to, and the benefit of, Korean patent application No. 10-2019-0130217, filed on Oct. 18, 2019, the entire disclosure of which is incorporated herein in its entirety by reference.

BACKGROUND

1. Field

Various embodiments of the present disclosure relate to a display device.

2. Description of Related Art

A display device may include a display panel that displays an image, a window that is located on the display panel, and a functional panel that is interposed between the display panel and the window to receive a touch input or to reduce or prevent the reflection of external light.

The flexible display device (and/or the display panel) may have bending and folding properties so that it can implement a large screen while being portable.

A bent region of a display device (and/or display panel) may be subjected to stress (e.g., stress or tensile force/compressive force) due to bending, so that the bent region has a strength that is lower than that of a non-bent region. The strength of the bent region may be compensated by using resin or the like applied to the inside of the bent region.

Because the stress of the bent region varies according to a position (or point), the curvature (or radius) of the bent region might not be uniform, variations in stress of the bent region may be increased, and defects (e.g. cracks) may occur at positions where stress is relatively high. For example, because the resin is applied to the bent region after the display device is bent, the resin may not control the curvature of the bent region.

The curvature (or average curvature) of the bent region may be reduced in response to the thinness of the display device, and variations in stress of the bent region may be further increased.

SUMMARY

Various embodiments of the present disclosure are directed to a display device including a bent region having uniform curvature and improved strength.

An embodiment of the present disclosure may provide a display device including a substrate including a first flat region and a second flat region spaced apart from each other, and a bendable region between the first flat region and the second flat region, a display layer on a first surface of the substrate in the first flat region, and configured to display an image, a first passivation layer on the first surface of the substrate in the bendable region, a second passivation layer on a second surface of the substrate, the second passivation layer defining cavities spaced apart from each other in the bendable region, and support members on the second surface of the substrate in the first flat region and the second flat region, wherein a first density of the cavities corresponding to a first area in the bendable region is less than an average density of the cavities, and wherein a first bending stress of the substrate at the first area is greater than an average bending stress of the substrate in the bendable region.

A thickness of the first passivation layer may be constant throughout the bendable region, and wherein the first bending stress of the substrate increases, and the first density of the cavities decreases, in the first area in a direction away from the first flat region.

The bendable region may include a first adjacent region that is adjacent to the first flat region, a second adjacent region that is adjacent to the second flat region, and an intermediate region between the first adjacent region and the second adjacent region, wherein a bending stress of the substrate in the first adjacent region is less than the average bending stress of the substrate in the bendable region, wherein a bending stress of the substrate in the intermediate region is greater than the average bending stress of the substrate in the bendable region, and wherein a density of first cavities in the first adjacent region is greater than a density of second cavities in the intermediate region.

A depth of the first cavities may be greater than a depth of the second cavities.

A number of the first cavities in a unit area may be equal to a number of the second cavities in the unit area.

An average diameter, an average width, or an average area of the first cavities may be greater than an average diameter, an average width, or an average area of the second cavities.

Each of the cavities may have a planar shape of a circle or tetragon, and wherein the cavities are arranged in a staggered manner along a direction in which the first flat region and the second flat region are spaced apart from each other.

Each of the cavities may have a bar-shaped planar shape, and may extend in a direction perpendicular to the direction in which the first flat region and the second flat region are spaced apart from each other.

The bendable region may include a first adjacent region that is adjacent to the first flat region, a second adjacent region that is adjacent to the second flat region, and an intermediate region between the first adjacent region and the second adjacent region, wherein a first thickness of the first passivation layer at the first adjacent region is less than a second thickness of the first passivation layer at the intermediate region, and wherein a density of first cavities at the first adjacent region is less than a density of second cavities at the intermediate region.

An area of the intermediate region may be greater than a total area of the first adjacent region and the second adjacent region.

The density of the cavities in the intermediate region may decrease in a direction toward the first adjacent region, and wherein the density of the cavities in the first adjacent region increases in a direction toward the first flat region.

The bendable region may include a first adjacent region that is adjacent to the first flat region, a second adjacent region that is adjacent to the second flat region, and an intermediate region between the first adjacent region and the second adjacent region, wherein a first thickness of the first passivation layer at the first adjacent region is greater than a second thickness of the first passivation layer at the intermediate region, and wherein a density of first cavities at the first adjacent region is greater than a density of second cavities at the intermediate region.

A bending stress of the substrate in the first adjacent region may be less than the average bending stress of the substrate, wherein a bending stress of the substrate in the intermediate region is greater than the average bending stress of the substrate, and wherein an area of the intermediate region is less than an area of the first adjacent region, and is less than an area of the second adjacent region.

The density of the cavities in the intermediate region may increase in a direction toward the first adjacent region, and wherein the density of the cavities in the first adjacent region is constant.

An embodiment of the present disclosure may provide a display device including a substrate including a first flat region and a second flat region spaced apart from each other, and a bendable region between the first flat region and the second flat region, a display layer on a first surface of the substrate in the first flat region, and configured to display an image, a first passivation layer on the first surface of the substrate in the bendable region, a second passivation layer on a second surface of the substrate in the bendable region, and including cavities that are spaced apart from each other, and support members on the second surface of the substrate in the first flat region and the second flat region, wherein a first depth of the cavities at a first area is less than an average depth of the cavities, and wherein a first bending stress at the first area of the bendable region is greater than an average bending stress of the bendable region.

DETAILED DESCRIPTION

Figure 1:
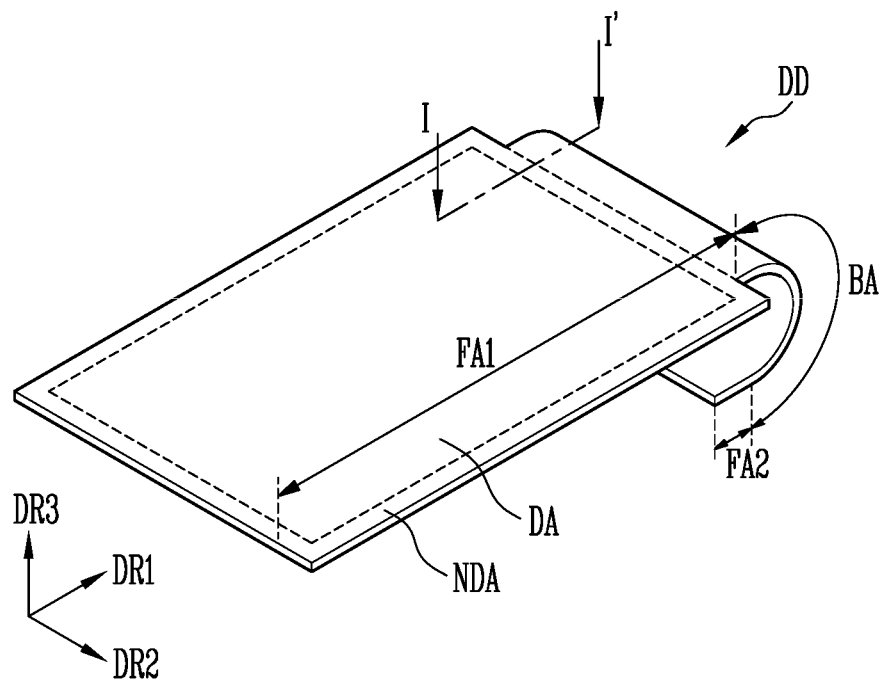
FIG. 1 is a perspective view illustrating a display device in accordance with embodiments of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," "planar shape," or "plan view," means viewing a target portion from the top, and the phrase "on a cross-section" means viewing a cross-section formed by vertically cutting a target portion from the side.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a display device in accordance with some embodiments of the present disclosure.

Referring to FIG. 1, the display device DD may include a display region DA, and a non-display region NDA that is provided on at least one side of the display region DA.

The display device DD may substantially have the shape of a tetragon, for example, a rectangle. The display device DD may include a pair of long sides that are parallel to each other in a first direction DR1, and a pair of short sides that are parallel to each other in a second direction DR2. However, the shape of the display device DD is not limited thereto, and the display device DD may have various shapes. For example, the display device DD may be provided in various forms, such as a closed polygon including linear sides, a circle, an ellipse, or the like including a side formed of a curved line, a semicircle, a semi-ellipse, or the like including sides formed of a linear line and a curved line, and so forth.

The display region DA may be a region in which an image is displayed through a plurality of pixels. The display region DA may be provided to have a shape corresponding to the shape of the display device DD. Each of the pixels may be a minimum unit for displaying the image (e.g., a smallest image-producing unit), and may emit white light and/or color light. For example, each of the pixels may emit any one color of red, green, blue and white, but it is not limited thereto, and the pixel may emit a color such as cyan, magenta, or yellow.

Each of the pixels may be a light emitting element including an organic emission layer, but the present disclosure is not limited thereto, and the pixel may be embodied in various forms such as a liquid crystal element, an electrophoretic element, and an electrowetting element in accordance with the concept of the present disclosure.

The non-display region NDA may be a region having no pixels, and in which no image is displayed. Wires coupled to the pixels and a driver for driving the pixels may be provided in the non-display region NDA.

According to some embodiments, the display device DD may have flexibility on at least a portion thereof, and may be folded on the portion having the flexibility.

In some embodiments, the display device DD may include first and second non-bent regions FA1 and FA2 (or first and second flat regions, or first and second non-bendable regions), and a bent region BA (e.g., a bendable region capable of being bent and unbent, or folded and unfolded) between the first and second non-bent regions FA1 and FA2.

Each of the first and second non-bent regions FA1 and FA2 may be a portion that is not folded and is generally flat, and may or may not have flexibility.

The bent region BA may extend from the first non-bent region FA1, may have flexibility, and may be folded (e.g., folded in one direction).

The second non-bent region FA2 may extend from the bent region BA. A first surface of the second non-bent region FA2 may face a first surface of the first non-bent region FA1 (e.g., when the bent region BA is bent or folded).

For reference, when a line along which the display device is folded is referred to as a folding line, the folding line may be provided in the bent region BA. In this regard, the term "fold" refers to the fact that the display device may be changed from the original shape thereof to another shape without being fixed in shape, and may have meanings of being "folded" along the folding line or "curved" or "rolled" in a scroll manner. Thus, FIG. 1 illustrates that the first surfaces of the first and second non-bent regions FA1 and FA2 are positioned parallel to each other and folded to face each other, but the present disclosure is not limited thereto. For example, the first surfaces of the first and second non-bent regions FA1 and FA2 may form a predetermined angle (e.g. an acute angle, a right angle, or an obtuse angle).

Figure 2:
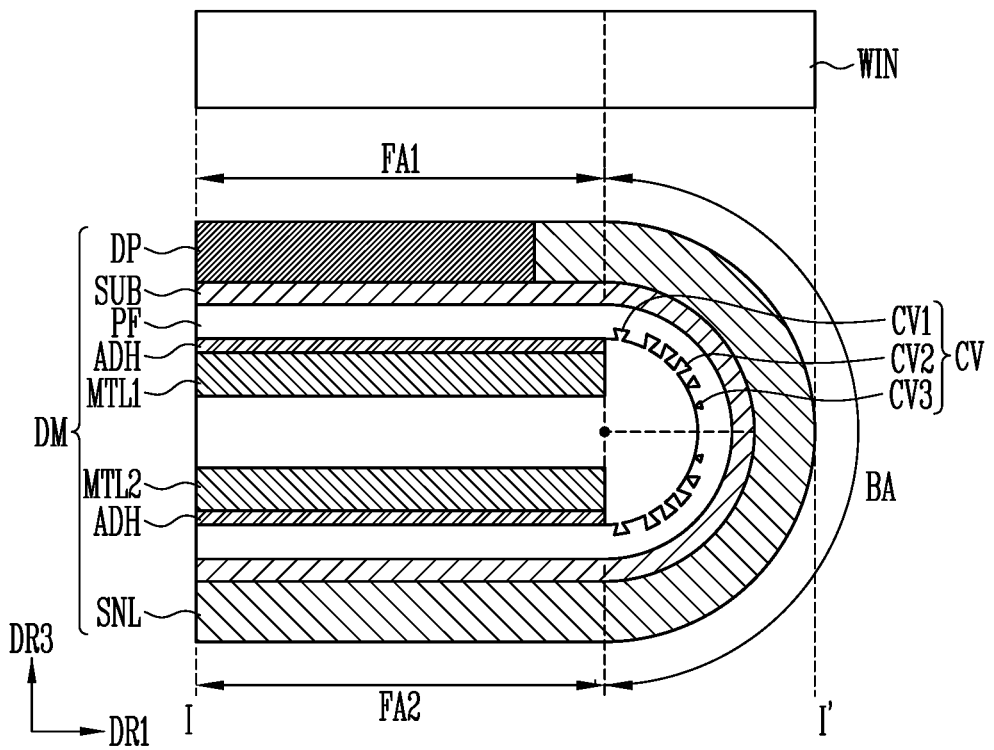
FIG. 2 is a sectional view illustrating an example of the display device taken along the line I-I' of FIG. 1.
Figure 3:
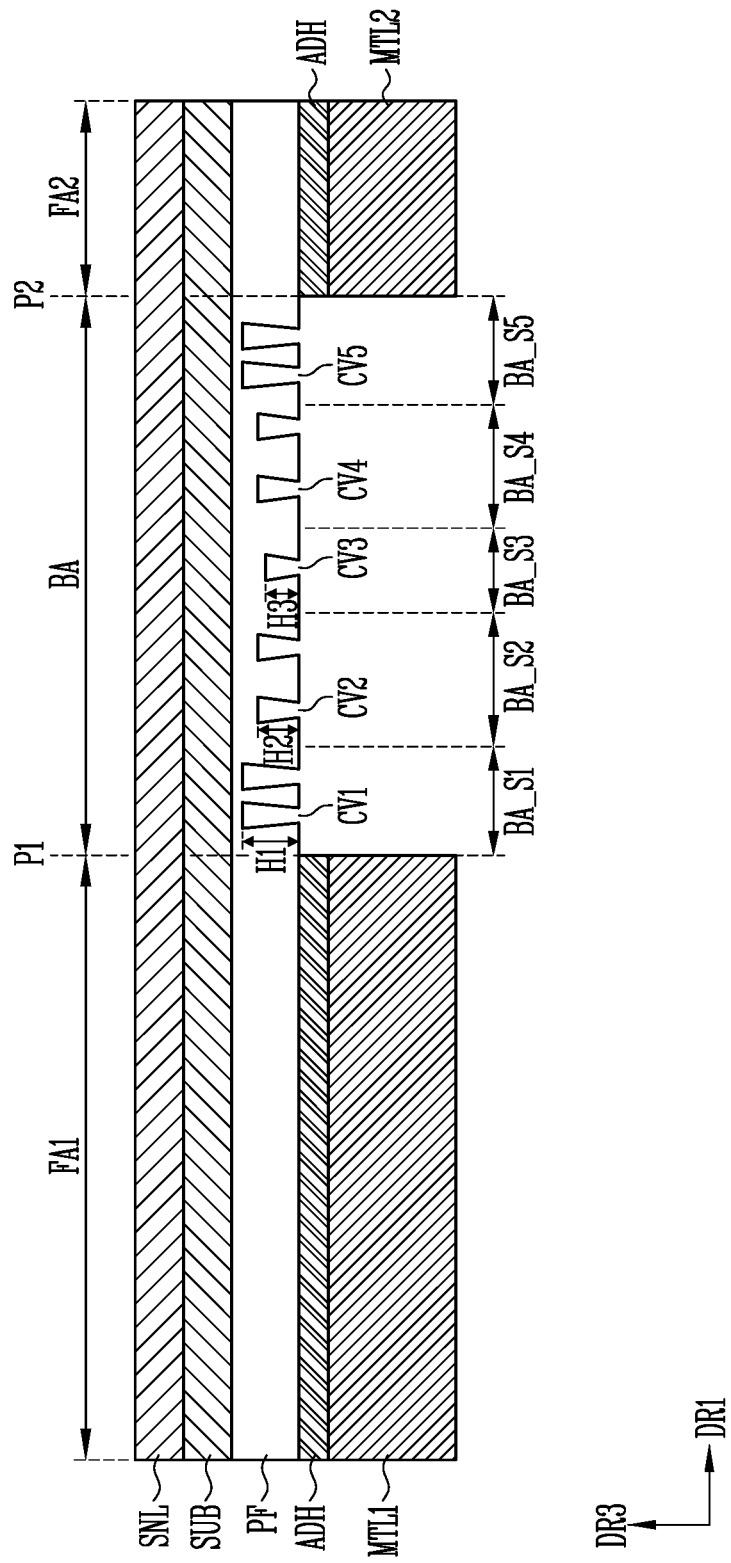
FIG. 3 is a sectional view illustrating an example of the display device of FIG. 2.

FIG. 2 is a sectional view illustrating an example of the display device taken along the line I-I' of FIG. 1. FIG. 2 illustrates the bent region in a folded state. FIG. 3 is a sectional view illustrating an example of the display device of FIG. 2. FIG. 3 illustrates the bent region BA in an unfolded state.

Referring to FIGS. 2 and 3, the display device DD (see FIG. 1) may include a display module DM and a window WIN. The display module DM may include a substrate SUB, a display layer DP, a first passivation layer SNL (or a stress neutralizing layer), a second passivation layer PF (or a passivation film), an adhesive layer ADH, and first and second support members MTL1 and MTL2.

The substrate SUB may contain a material having flexibility so as to be bendable or foldable, and may have a single-layer or a multi-layer structure.

For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be changed in various ways, and/or the substrate SUB may be made of fiber-reinforced plastic (FRP) or the like.

The display layer DP may be provided on a first surface of the substrate SUB in the first non-bent region FA1. Here, the third direction DR3 may be normal to the first surface of the substrate SUB in the first non-bent region FA1.

The display layer DP may include the pixels described with reference to FIG. 1. For example, the display layer DP may include organic light-emitting diodes. Although FIG. 2 illustrates that the display layer DP is provided only on the first non-bent region FA1, the display layer DP is not limited thereto. For example, the display layer DP may also be provided in the second non-bent region FA2.

The first passivation layer SNL may be located on the first surface of the substrate SUB to correspond to the bent region BA. That is, the first passivation layer SNL may be located on the first surface of the substrate SUB in the bent region BA. The first passivation layer SNL may be at the same layer as the display layer DP, and may extend to the second non-bent region FA2. In other words, the first passivation layer SNL may also be located on the second non-bent region FA2. The first passivation layer SNL may include an organic insulating material, and/or an inorganic insulating material and the like, which may protect the substrate SUB (or a conductive layer provided on the substrate SUB) from external moisture, shocks, and the like.

For reference, when the substrate SUB (or a stacked structure) is bent, a stress neutral plane may be present at or in the substrate SUB. The first passivation layer SNL may adjust the position of the stress neutral plane of the substrate SUB in the bent region BA. For example, by adjusting the thickness and/or modulus of the first passivation layer SNL, the stress neutral plane may be located in proximity to a specific layer (e.g. the conductive layer such as the wires) of the stacked structure including the substrate SUB and the first passivation layer SNL.

In some embodiments, the thickness of the first passivation layer SNL may be substantially uniform. For example, the thickness of the first passivation layer SNL at a first point P1 and the thickness of the first passivation layer SNL at a second point P2 may be equal to the average thickness of the first passivation layer SNL. However, the thickness of the first passivation layer SNL is not limited thereto. The thickness of the first passivation layer SNL may vary according to a position in the bent region BA. This will be described later with reference to FIGS. 11 to 14.

The second passivation layer PF may be located on a second surface (e.g., a rear surface or lower surface) of the substrate SUB. The second passivation layer PF may be located on an entirety of the second surface of the substrate SUB.

Similar to the substrate SUB, the second passivation layer PF may include polyethylene terephthalate (PET) or polyimide (PI).

The second passivation layer PF may include a pressure sensitive adhesive that may be provided on a first surface of the second passivation layer PF and may be attached to the second surface of the substrate SUB.

In some embodiments, the second passivation layer PF may include one or more cavities CV in the bent region BA. Here, each of the cavities CV may be an empty space, a groove, or a concave pattern formed in the second passivation layer PF.

The cavities CV will be described with reference to FIG. 4.

Figure 4:
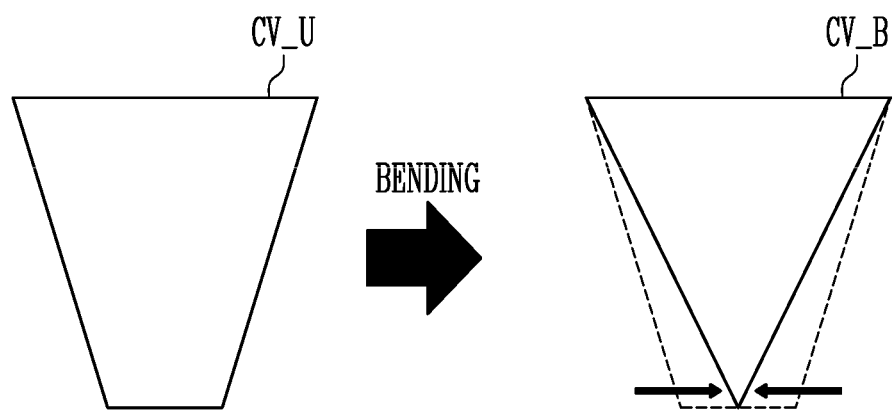
FIG. 4 is a sectional view illustrating an example of a cavity included in the display device of FIG. 3.

FIG. 4 is a sectional view illustrating an example of the cavity included in the display device of FIG. 3.

Referring to FIG. 4, the cavity CV_U in a first state (e.g., unbent state) may show the second passivation layer PF illustrated in FIG. 3, that is, the cavity included in the second passivation layer PF of the display device before bending. The cavity CV_B in a second state (e.g., bent state) may show the second passivation layer PF illustrated in FIG. 2, that is, the cavity included in the second passivation layer PF of the display device after bending.

The cavity CV_U of the first state may have the sectional shape of a reverse trapezoid. However, this is merely an example, and the cavity CV_U of the first state may have the sectional shape of a tetragon or a trapezoid.

By the bending of the display device, both sides of the cavity CV_U of the first state may contact each other, and the cavity CV_B of the second state may have the shape of a triangular section. While the cavity CV_U of the first state is transformed into the cavity CV_B of the second state, the stress of the substrate SUB (or the display device) may be compensated.

Turning back to FIGS. 2 and 3, the cavities CV may have different densities (e.g., intervals) or different sizes (e.g., depths) for each region based on a corresponding stress (e.g., stress due to bending) of the substrate SUB (or of the display module DM). For example, the cavities CV may be formed on a second surface (e.g., the lower surface) of the second passivation layer PF through laser irradiation. The cavities CV may have different sizes according to the intensity of a corresponding laser (or laser beams) and/or the laser irradiation time.

In some embodiments, if the stress at a point or portion (e.g., at a central portion of the bent region BA) is greater than the average stress of an entirety of the bent region BA, a first density of the cavities CV corresponding to the portion having greater than average stress may be designed to be less than the average density of the cavities CV.

Referring to FIG. 3, the bent region BA may include first to fifth sub regions BA_S1 to BA_S5 (i.e., BA_S1, BA_S2, BA_S3, BA_S4, and BA_S5). The first to fifth sub regions BA_S1 to BA_S5 may be sequentially positioned from a first point, or first location, P1 (e.g., a boundary point or region between the first non-bent region FA1 and the bent region BA) to a second point, or second location, P2 (e.g., a boundary point or region between the second non-bent region FA2 and the bent region BA).

The stresses of the substrate SUB in the first to fifth sub regions BA_S1 to BA_S5 may be different from each other. For example, the stress of the substrate SUB in the first sub region BA_S1 may be less than the stress of the substrate SUB in the second sub region BA_S2, and the stress of the substrate SUB in the second sub region BA_S2 may be less than the stress of the substrate SUB in the third sub region BA_S3. Based on the third sub region BA_S3, the fourth sub region BA_S4 may correspond to the second sub region BA_S2, and the fifth sub region BA_S5 may correspond to the first sub region BA_S1.

In the first sub region BA_S1, which may be referred to as a first adjacent region, the second passivation layer PF may include a first cavity CV1. In the second sub region BA_S2, the second passivation layer PF may include a second cavity CV2. In the third sub region BA_S3, which may be referred to as an intermediate region, or as a portion thereof, the second passivation layer PF may include a third cavity CV3. The second passivation layer PF may include fourth and fifth cavities CV4 and CV5 respectively corresponding to the fourth and fifth sub regions BA_S4 and BA_S5. As the fourth sub region BA_S4 and the fifth sub region BA_S5 may correspond to the second sub region BA_S2 and the first sub region BA_S1, respectively, the fourth cavity CV4 and the fifth cavity CV5 may be substantially equal to the second cavity CV2 and the first cavity CV1, respectively.

In some embodiments, the size of the first cavity CV1 of the first sub region BA_S1 may be larger than the size of the second cavity CV2 of the second sub region BA_S2. For example, a first depth H1 of the first cavity CV1 may be greater than a second depth H2 of the second cavity CV2. Likewise, the size (e.g. the second depth H2) of the second cavity CV2 of the second sub region BA_S2 may be greater than the size (e.g. a third depth H3) of the third cavity CV3 of the third sub region BA_S3.

In some embodiments, the cavity density of the first sub region BA_S1 may be greater than the cavity density of the second sub region BA_S2. For example, a first interval between the first cavity CV1 and a cavity adjacent thereto in the first sub region BA_S1 may be less than a second interval between the second cavity CV2 and a cavity adjacent thereto in the second sub region BA_S2. Similarly, the cavity density in the second sub region BA_S2 may be greater than the cavity density in the third sub region BA_S3.

The relationship between the stress of the substrate SUB and the cavities CV will be described later with reference to FIG. 6.

First and second support members MTL1 and MTL2 may be located on the second surface of the substrate SUB in the first and second non-bent regions FA1 and FA2, respectively. The first support member MTL1 may overlap with the substrate SUB in the first non-bent region FA1, and may be attached to the second surface of the substrate SUB through the adhesive layer ADH. Here, the adhesive layer ADH may include a pressure sensitive adhesive. Likewise, the second support member MTL2 may overlap with the substrate SUB in the second non-bent region FA2, and may be attached to the second surface of the substrate SUB through the adhesive layer ADH.

The first and second support members MTL1 and MTL2 may have rigidity, may include, for example, metal, and may support the first and second non-bent regions FA1 and FA2 of the substrate SUB, respectively. The first and second non-bent regions FA1 and FA2 of the substrate SUB may be kept substantially flat by the first and second support members MTL1 and MTL2.

The window WIN may be provided on the display module DM, and may include glass, sapphire, plastic or the like. The window WIN may have a single-layer or multi-layer structure. The window WIN may include a pattern layer (or an achromatic layer) that provides a specific pattern or achromatic color corresponding to the bent region BA. In addition, the window WIN may further include a functional coating layer(s), such as an anti-fingerprint layer, an anti-reflection layer, and/or a hard coating layer.

According to some embodiments, a functional module may be provided between the display module DM and the window WIN.

For example, the functional module may include an input sensing module. The input sensing module may sense various types of inputs provided from the outside of the display device. For example, the input sensing module may sense various types of inputs such as light, heat, and/or pressure generated by a user's body.

As described with reference to FIGS. 3 and 4, the second passivation layer PF may include the cavities CV. The cavities CV may have different densities and/or sizes corresponding to the stress for each position of the substrate SUB.

Figure 5A:
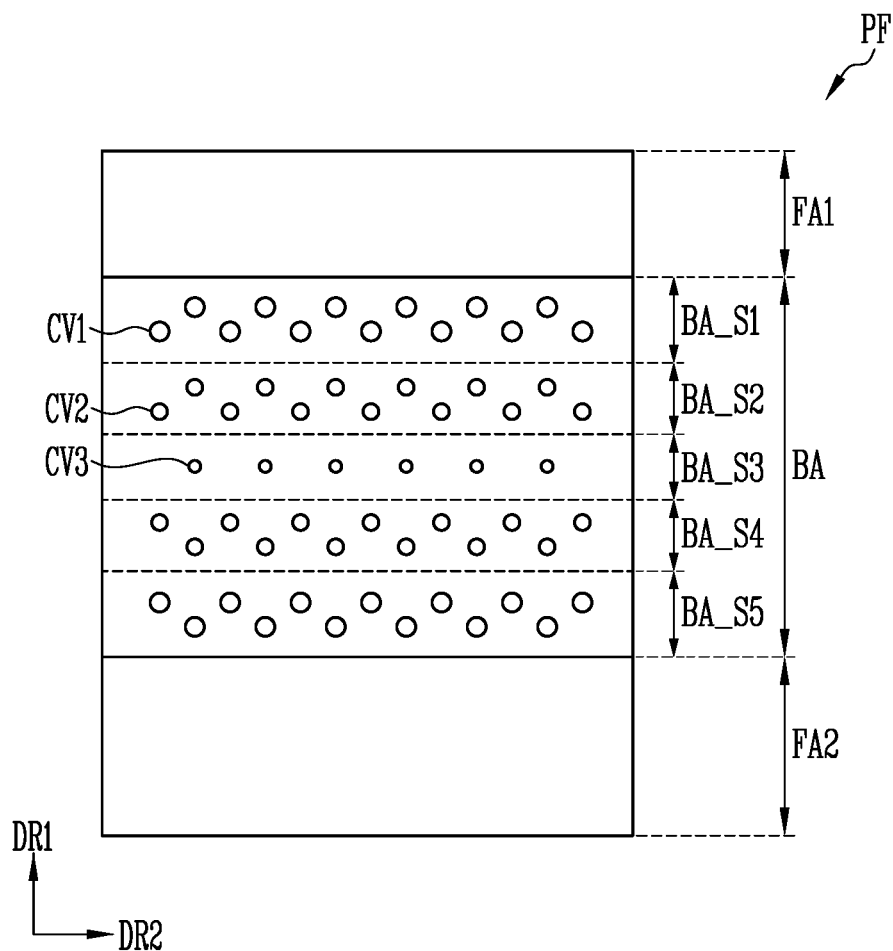
FIGS. 5A to 5C are plan views illustrating an example of a second passivation layer included in the display device of FIG. 3.
Figure 5B:
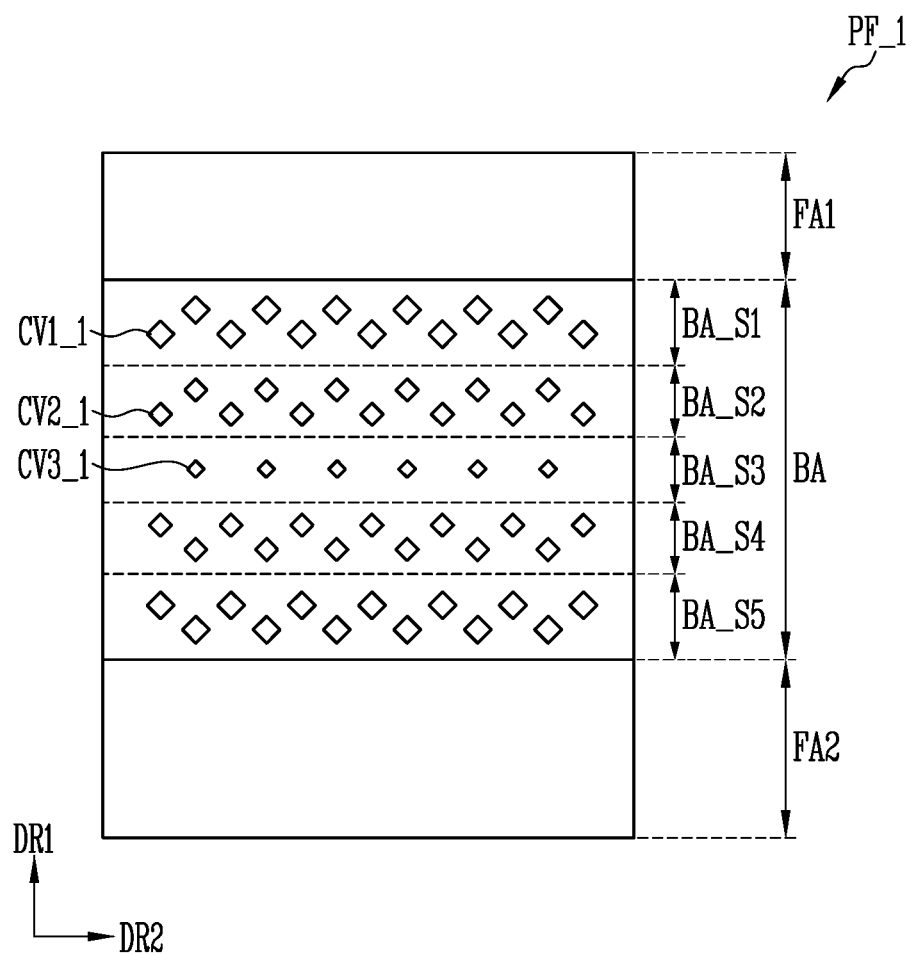
Figure 5C:
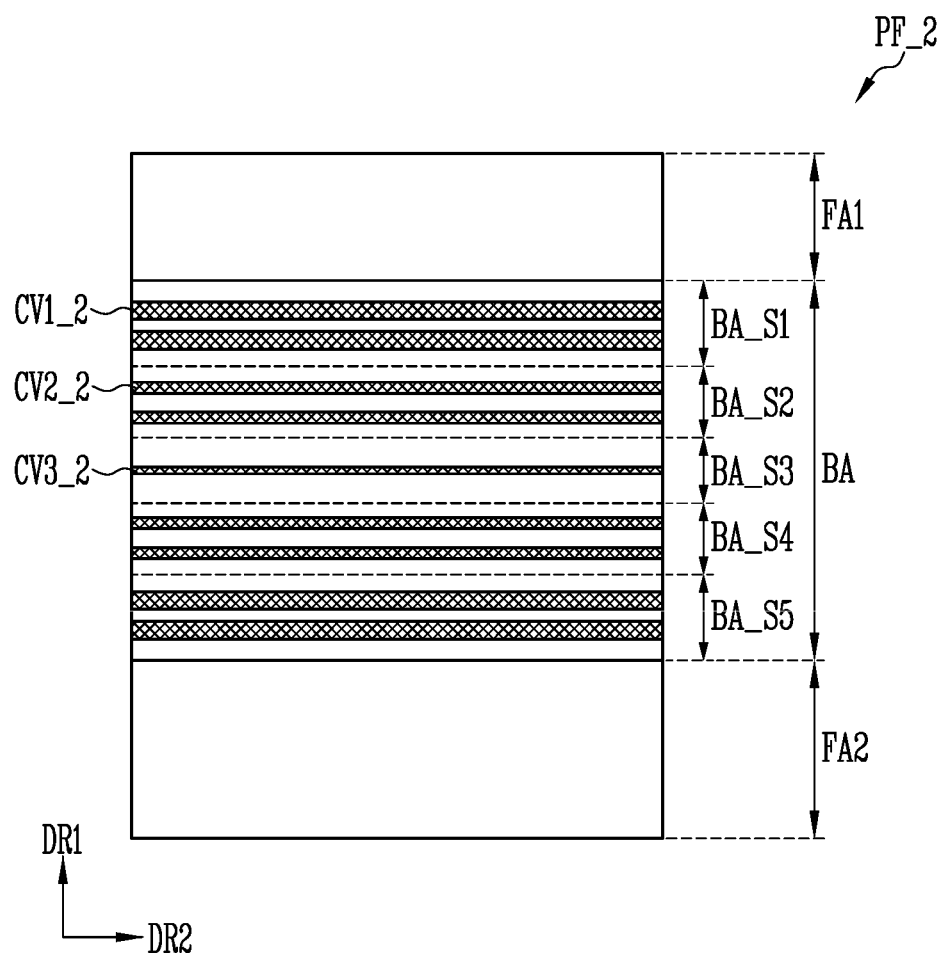

FIGS. 5A to 5C are plan views illustrating examples of the second passivation layer PF included in the display device of FIG. 3. Because the fourth sub region BA_S4 and the fifth sub region BA_S5 are substantially equal to the second sub region BA_S2 and the first sub region BA_S1, respectively, the second passivation layer PF will be described based on the first to third sub regions BA_S1, BA_S2, and BA_S3.

First, referring to FIGS. 3 and 5A, the first to third cavities CV1, CV2, and CV3 may be distributed in the bent region BA.

Each of the first to third cavities CV1, CV2, and CV3 may have a circular planar shape. When seen from the plan view, a first area of the first cavity CV1 may be larger than a second area of the second cavity CV2, and the second area of the second cavity CV2 may be larger than a third area of the third cavity CV3.

The first to third cavities CV1, CV2, and CV3 may be arranged along the first direction DR1 in a staggered manner. However, this is merely illustrative, and the arrangement of the first to third cavities CV1, CV2, and CV3 is not limited thereto.

The first to third cavities CV1, CV2, and CV3 may be arranged along the first direction DR1 in a staggered manner, and each of the first to third cavities CV1, CV2, and CV3 may be repeatedly located along the second direction DR2. That is, the first to third cavities CV1, CV2, and CV3 may be arranged in a mosaic form. However, this is merely illustrative, and the arrangement of the first to third cavities CV1, CV2, and CV3 is not limited thereto.

FIG. 5A illustrates that the densities (e.g., numbers per unit area) of the first to third cavities CV1, CV2, and CV3 are equal or similar to each other. However, this is merely illustrative, and is not limited thereto. For example, the density (or number per unit area) of the first cavity CV1 of the first sub region BA_S1 may be greater than the density (or number per unit area) of the second cavity CV2 of the second sub region BA_S2.

Referring to FIG. 5B, each of the first to third cavities CV1_1, CV2_1, and CV3_1 may have the planar shape of a tetragon (or rhombus). When seen from the plan view, a first area of the first cavity CV1_1 may be greater than a second area of the second cavity CV2_1, and the second area of the second cavity CV2_1 may be greater than a third area of the third cavity CV3_1.

However, the planar shape of each of the first to third cavities CV1_1, CV2_1, and CV3_1 is not limited thereto. For example, each of the first to third cavities CV1_1, CV2_1, and CV3_1 may have a planar shape, such as a polygon or an ellipse.

Referring to FIG. 5C, each of the first to third cavities CV1_2, CV2_2, and CV3_2 may have a bar shape, and may extend along the second direction DR2. For example, each of the first to third cavities CV1_2, CV2_2, and CV3_2 may extend from one side of the second passivation layer PF to the other side thereof. A first width of the first cavity CV1_2 may be greater than a second width of the second cavity CV2_2, while the second width of the second cavity CV2_2 may be greater than a third width of the third cavity CV3_2.

As described with reference FIGS. 5A to 5C, the cavities may have various planar shapes.

Figure 6:
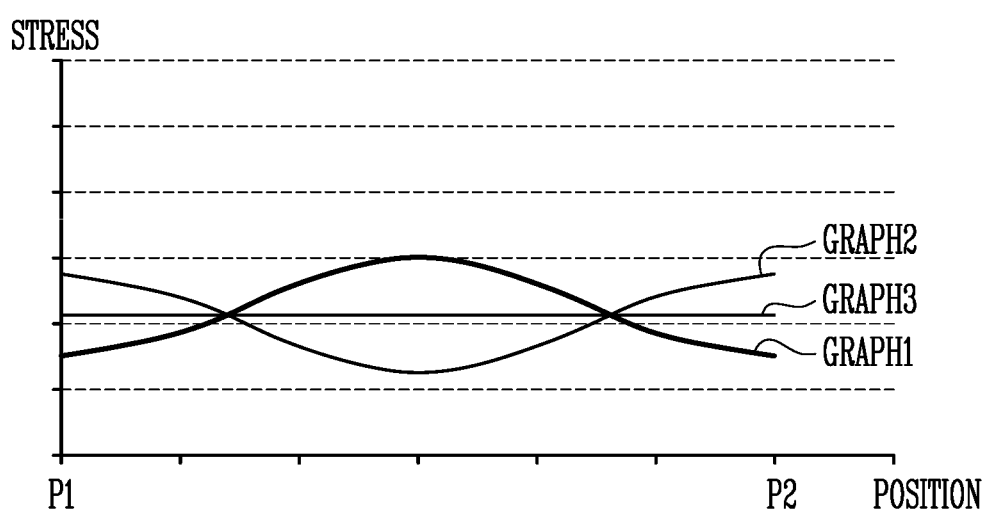
FIG. 6 is a diagram illustrating a stress of a bent region of the display device of FIG. 3.
Figure 7:
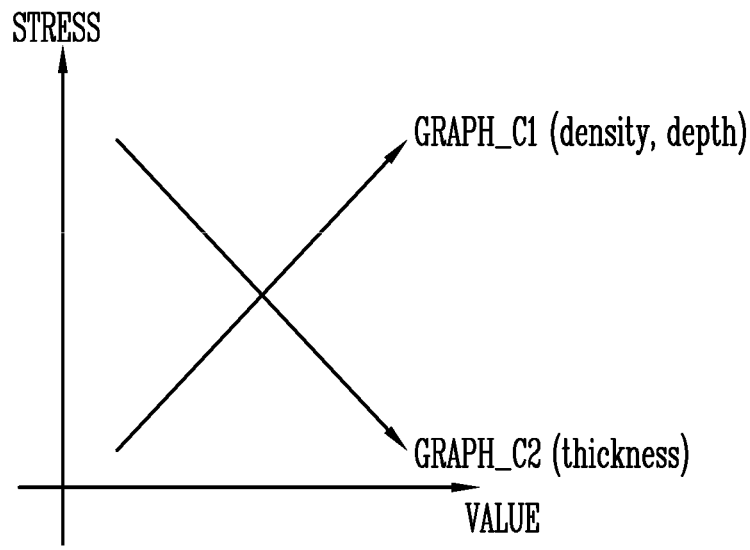
FIG. 7 is a diagram illustrating a relationship between the second passivation layer of FIG. 4 and a stress of the bent region.

FIG. 6 is a diagram illustrating the stress of the bent region of the display device of FIG. 3. FIG. 7 is a diagram illustrating a relationship between the second passivation layer PF of FIG. 4 and the stress of the bent region.

Referring to FIG. 6, a first graph GRAPH1 may represent the stress of the substrate SUB for each position of the bent region BA (e.g., for each position in the first direction DR1 shown in FIG. 3). The stress of the substrate SUB according to the first graph GRAPH1 may omit the influence of the second passivation layer PF. In FIG. 6, the stress of the substrate SUB may be expressed as a ratio of the stress of a corresponding point to the average stress of the substrate SUB.

According to the first graph GRAPH1, each of the stress of the substrate SUB at the first point P1 and the stress of the substrate SUB at the second point P2 may be relatively low, and the stress of the substrate SUB at a central point spaced apart from the first point P1 and the second point P2 may be relatively high. Because the first and second non-bent regions FA1 and FA2 adjacent to the first and second points P1 and P2, respectively, are supported by the first and second support members MTL1 and MTL2, the level of stress of the substrate SUB may decrease as the distance from the first and second points P1 and P2 decreases.

A second graph GRAPH2 may represent the stress applied to the substrate SUB by the second passivation layer PF, namely, the stress of the substrate SUB. A third graph GRAPH3 may show a target stress of the substrate SUB, which may be equal to the sum of the stress of the substrate SUB according to the first graph GRAPH1 and the stress of the substrate SUB according to the second graph GRAPH2.

According to the third graph GRAPH3, the stress of the substrate SUB may be uniform (or nearly constant) regardless of a position, and the second graph GRAPH2 may be symmetrical with the first graph GRAPH1 based on, or with respect to, the third graph GRAPH3.

That is, a compensation value (or stress) for each position, which is to be compensated at the substrate SUB (or the display device) due to the second passivation layer PF, may be derived based on the first graph GRAPH1. The distribution, sizes, and densities of the cavities CV (see FIG. 3) in the second passivation layer PF may be determined based on the derived compensation value, namely, the second graph GRAPH2.

Referring to FIGS. 3 and 7, a first characteristic graph GRAPH_C1 represents a change in stress of the substrate SUB as a function of the density or depth (or size) of the cavities CV in the second passivation layer PF.

According to the first characteristic graph GRAPH_C1, the larger the density of the cavities CV in the second passivation layer PF, the higher the stress of the substrate SUB at a corresponding point may be. Similarly, the larger the depth (or the size) of the cavities CV in the second passivation layer PF may be, the higher the stress of the substrate SUB at the corresponding point may be.

The second characteristic graph GRAPH_C2 represents a change in stress of the substrate SUB as a function of the thickness of the second passivation layer PF.

According to the second characteristic graph GRAPH_C2, the greater the thickness of the second passivation layer PF, the lower the stress of the substrate SUB at a corresponding point may be.

In other words, based on the stress of the substrate SUB according to the second graph GRAPH2 shown in FIG. 6, the thickness of the second passivation layer PF and the density and/or depth of the cavities CV may be determined.

Hereinafter, the process of setting the thickness of the second passivation layer PF and the density and/or depth of the cavities CV will be described with reference to FIGS. 8A to 9D.

Figure 8A:
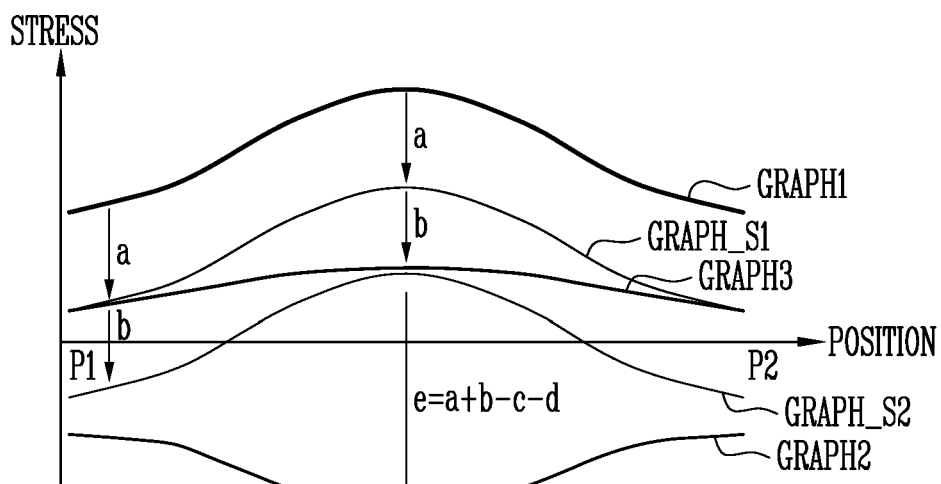
FIG. 8A is a diagram illustrating a process of compensating for the stress of the bent region of the display device of FIG. 3.
Figure 8B:
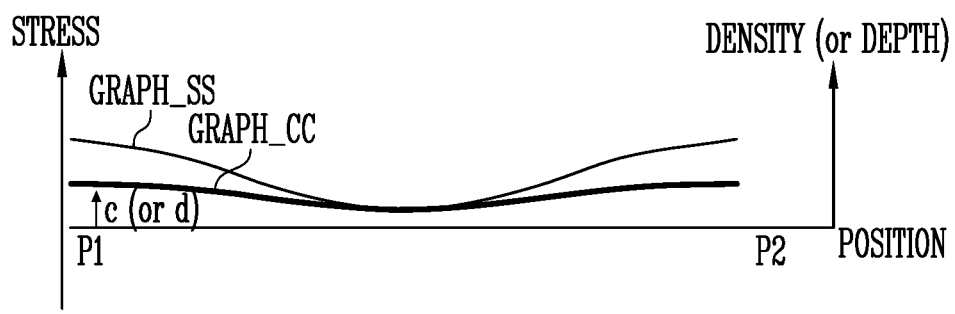
FIG. 8B is a diagram illustrating the stress of the bent region by the second passivation layer included in the display device of FIG. 3.

FIG. 8A is a diagram illustrating a process of compensating for the stress of the bent region of the display device of FIG. 3. FIG. 8B is a diagram illustrating the stress of the bent region due to the second passivation layer being included in the display device of FIG. 3. FIGS. 9A to 9D are diagrams illustrating the second passivation layer according to the stress compensation process of FIG. 8A.

First, referring to FIGS. 3 and 8A, the first graph GRAPH1 represents the stress of the substrate SUB for each position of the bent region BA (e.g., for each position in the first direction DR1 shown in FIG. 3), and may be equal or similar to the first graph GRAPH1 described with reference to FIG. 6.

Figure 9A:
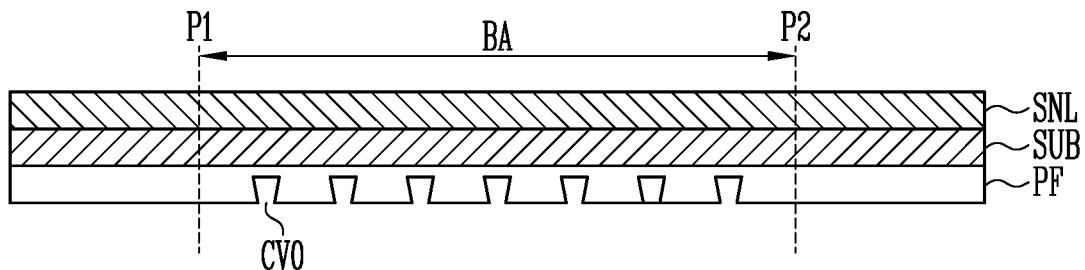
FIGS. 9A to 9D are diagrams illustrating the second passivation layer according to the stress compensation process of FIG. 8A.

Referring to FIGS. 8A and 9A, a first compensation graph GRAPH_S1 may represent the stress of a first stacked structure having the first passivation layer SNL and the substrate SUB. The first stacked structure may further include the second passivation layer PF. Here, the second passivation layer PF shown in FIG. 9A may have a thickness (e.g., a preset thickness), and may also include reference cavities CV0 that are uniformly distributed in the bent region BA.

When the first passivation layer SNL is formed on the first surface of the substrate SUB with a respective thickness (e.g., a predetermined thickness) for each position, the stress of the substrate SUB may be uniformly reduced throughout the bent region BA in proportion to the thickness of the first passivation layer SNL. A first stress change amount (or stress reduction amount) according to the thickness of the first passivation layer SNL is defined as "a". The stress reduction amount at the first point P1 of the bent region BA according to the thickness of the first passivation layer SNL may be equal to or similar to the stress reduction amount at the central point of the bent region BA.

The thickness of the first passivation layer SNL may be set such that the stress of the substrate SUB at the first point P1 (and at the second point P2) is equal to a reference value (e.g. 0). In this case, in a state where the display device is bent (e.g. the display device of FIG. 2), the first passivation layer SNL might not be separated from, or come off from, the substrate SUB at the first point (and the second point P2).

Figure 9B:
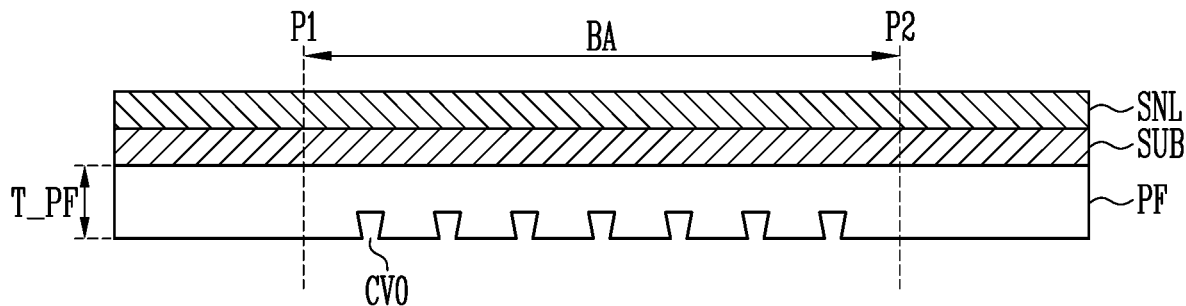

Referring to FIGS. 8A and 9B, a second compensation graph GRAPH_S2 may represent the stress of a second stacked structure shown in FIG. 9B. The second stacked structure may include the second passivation layer PF having a different reference thickness T_PF when compared to the stacked structure of FIG. 9A. That is, the thickness of the second passivation layer PF may be adjusted from the first stacked structure.

The stress of the substrate SUB may be uniformly reduced throughout the bent region BA in proportion to the thickness of the second passivation layer PF. A second stress change amount (or stress reduction amount) according to the thickness of the second passivation layer PF is defined as "b". The stress reduction amount at the first point P1 of the bent region BA according to the thickness of the second passivation layer PF may be substantially equal to, or similar to, the stress reduction amount at the central point of the bent region BA.

A reference thickness T_PF of the second passivation layer PF may be set such that the stress of the substrate SUB at the central point of the bent region BA is substantially equal to, or similar to, the reference value (e.g. 0).

Figure 9C:
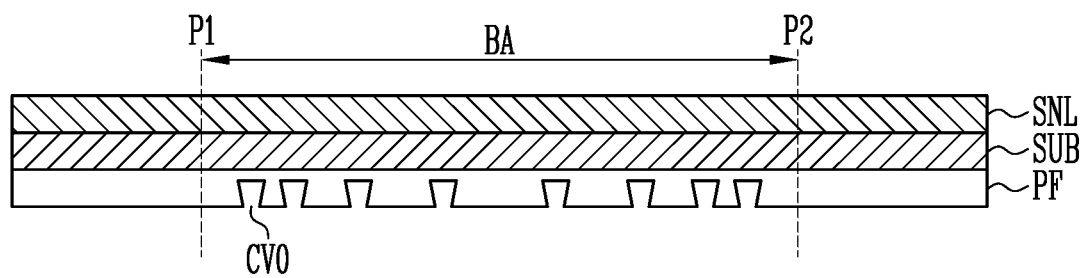

Referring to FIGS. 8A and 9C, the second graph GRAPH2 represents the stress acting on the substrate SUB due to the second passivation layer PF (and the first passivation layer SNL) shown in FIG. 9C (e.g., the stress of the substrate SUB). The second graph GRAPH2 may be similar to the second graph GRAPH2 described with reference to FIG. 6.

The third graph GRAPH3 represents the stress of a third stacked structure shown in FIG. 9C, and may be similar to the third graph GRAPH3 described with reference to FIG. 6. The third stacked structure may include cavities CV0 distributed at different densities for each position, unlike the stacked structure of FIG. 9B. That is, the density of the reference cavity CV0 may be adjusted for different respective positions in the second stacked structure.

Figure 9D:
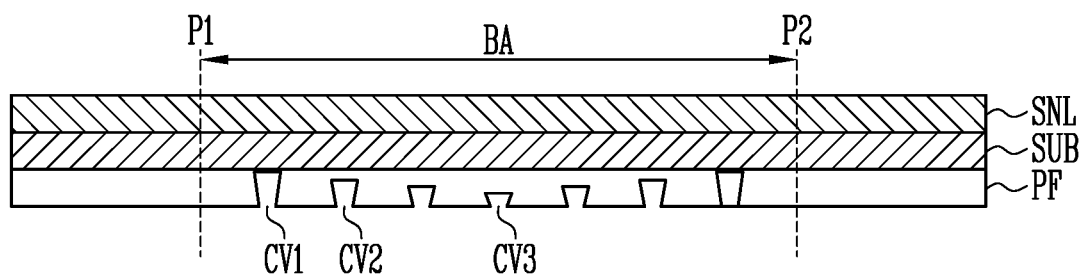

Further, the depth of the reference cavity CV0 may be adjusted for each position based on the density of the reference cavity CV0, and a fourth stacked structure may include first to third cavities CV1 to CV3 having different depths as shown in FIG. 9D.

As described with reference to FIG. 7, as the density of the reference cavity CV0 increases, a compensation amount for the stress of the substrate SUB may be reduced, and the stress of the substrate SUB may be relatively increased. Therefore, the density of the reference cavity CV0 in the region adjacent to the first point P1 (and the second point P2) that is relatively overcompensated may be set relatively high. The density of the reference cavity CV0 at a central point (e.g. a central point of the bent region BA) that is properly compensated or relatively undercompensated may be set relatively low. In other words, a panel stress concentrated on a relatively central location may be uniformly adjusted throughout the bent region BA.

Referring to FIG. 8B and 9C, a cavity graph GRAPH_CC may show the density (or depth) with respect to the reference cavity CV0 for each position, and a stress graph GRAPH_SS may show the stress of the substrate SUB according to the cavity graph GRAPH_CC.

According to the cavity graph GRAPH_CC and the stress graph GRAPH_SS, the stress of the substrate SUB may be changed in proportion to the density of the reference cavity CV0. A third stress change amount at the first point P1 according to the density of the reference cavity CV0 may be defined as "c".

Likewise, according to the cavity graph GRAPH_CC and the stress graph GRAPH_SS, the stress of the substrate SUB may be changed in proportion to the depth of the reference cavity CV0. A fourth stress change amount at the first point P1 according to the depth of the reference cavity CV0 may be defined as "d".

In this case, the stress of the substrate SUB may be expressed as shown in Equation 1 below.

$$P' = P + Pc$$
$$= P - e$$
$$= P - (a + b - c - d)$$
$$= P - (K \times \text{SNL thickness} + L \times \text{PF thickness} - M \times CV - N \times CV) \quad \text{Equation 1}$$

Here, P' may denote the compensated stress of the substrate SUB (or the display device), P may denote an initial stress of the substrate SUB, Pc may denote a total stress compensation value, and e may denote a total stress change amount of the substrate SUB. Furthermore, K denotes a stress variation constant according to the thickness of the first passivation layer SNL, L denotes a stress variation constant according to the thickness of the second passivation layer PF, M denotes a stress variation constant according to the density of the cavities CV, and N denotes a stress variation constant according to the depth of the cavities CV.

The stress for each position in the bent region BA and the stress compensation value may be generalized as shown in Equation 2 below.

$$P = a + k\frac{1}{\sqrt{2\pi}}\exp\left\{\left(-\tfrac{1}{2}\left(x-\tfrac{d}{2}\right)^2\right)\right\}$$

$$Pc = b - k\frac{1}{\sqrt{2\pi}}\exp\left\{\left(-\tfrac{1}{2}\left(x-\tfrac{d}{2}\right)^2\right)\right\}$$

Equation 2

Here, a, b, and k may denote constants, and d may denote the length of the bent region BA (e.g. the distance between the first and second points P1 and P2).

As described with reference to FIGS. 8A to 9D, based on the stress of the substrate SUB, the thickness of the first passivation layer SNL, the thickness of the second passivation layer PF, the density of the cavity in the second passivation layer PF, and the depth of the cavity in the second passivation layer PF may be sequentially determined. Through a process of sequentially compensating for the stress of the substrate SUB, the stress of the substrate SUB (or the display device) may become uniform throughout the bent region BA. Thus, the curvature of the bent region BA may be uniform, and the strength of the bent region BA may be relatively improved.

Figure 10:
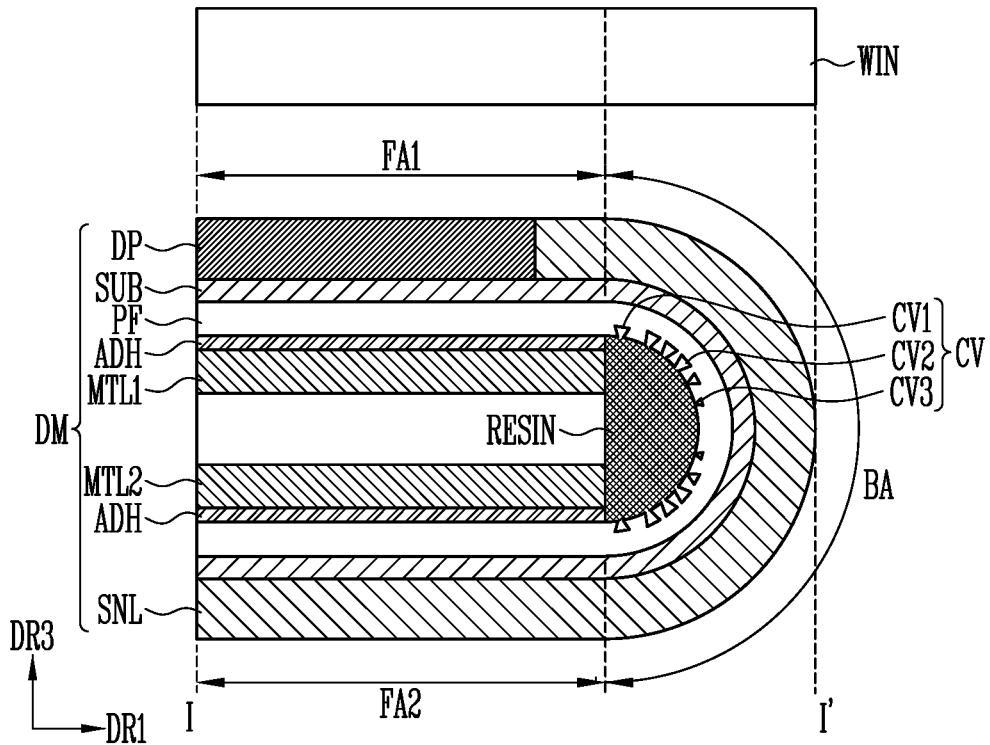
FIG. 10 is a sectional view illustrating another example of the display device of FIG. 1.

FIG. 10 is a sectional view illustrating another example of the display device of FIG. 1. FIG. 10 illustrates the section of the display device corresponding to the display device of FIG. 2.

Referring to FIGS. 2 and 10, the display device of FIG. 10 is different from the display device of FIG. 2 in that the display device of FIG. 10 further includes a third passivation layer RESIN.

The third passivation layer RESIN may be located on the second surface of the substrate SUB (or the second passivation layer PF) in the bent region BA.

The third passivation layer RESIN may include a common thermoplastic resin, and may be applied to the second surface of the second passivation layer PF after the display device is bent. The third passivation layer RESIN may support the bent region BA of the substrate SUB together with the first passivation layer SNL and the second passivation layer PF, and may keep the curvature of the bent region BA constant even if time has elapsed.

Figure 11:
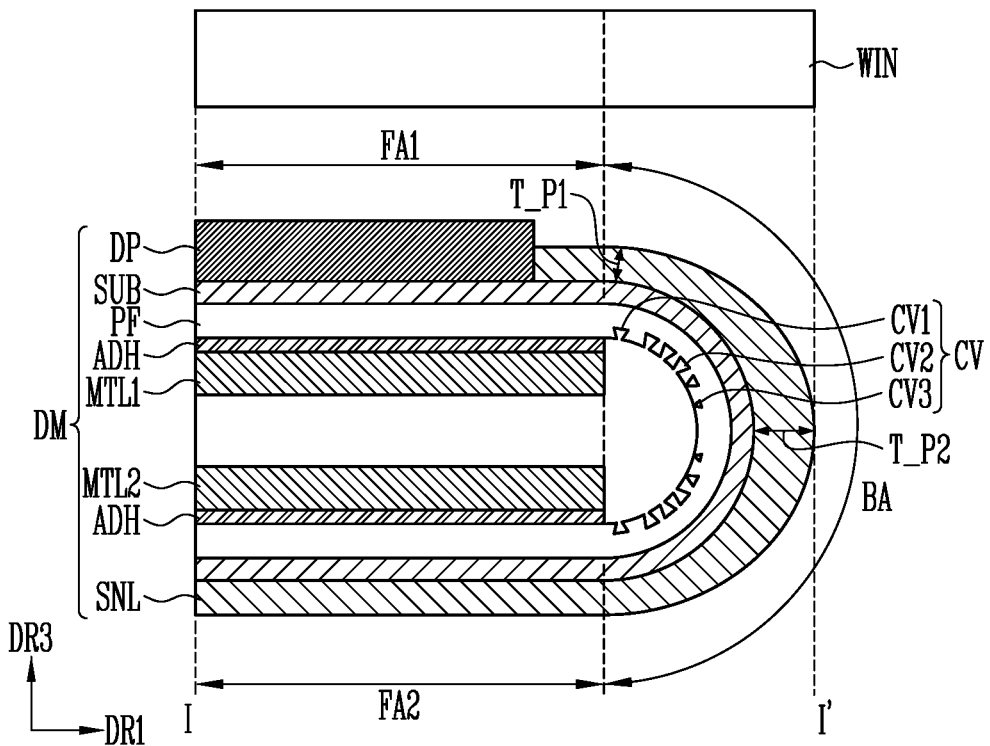
FIG. 11 is a sectional view illustrating a further example of the display device of FIG. 1.
Figure 12:
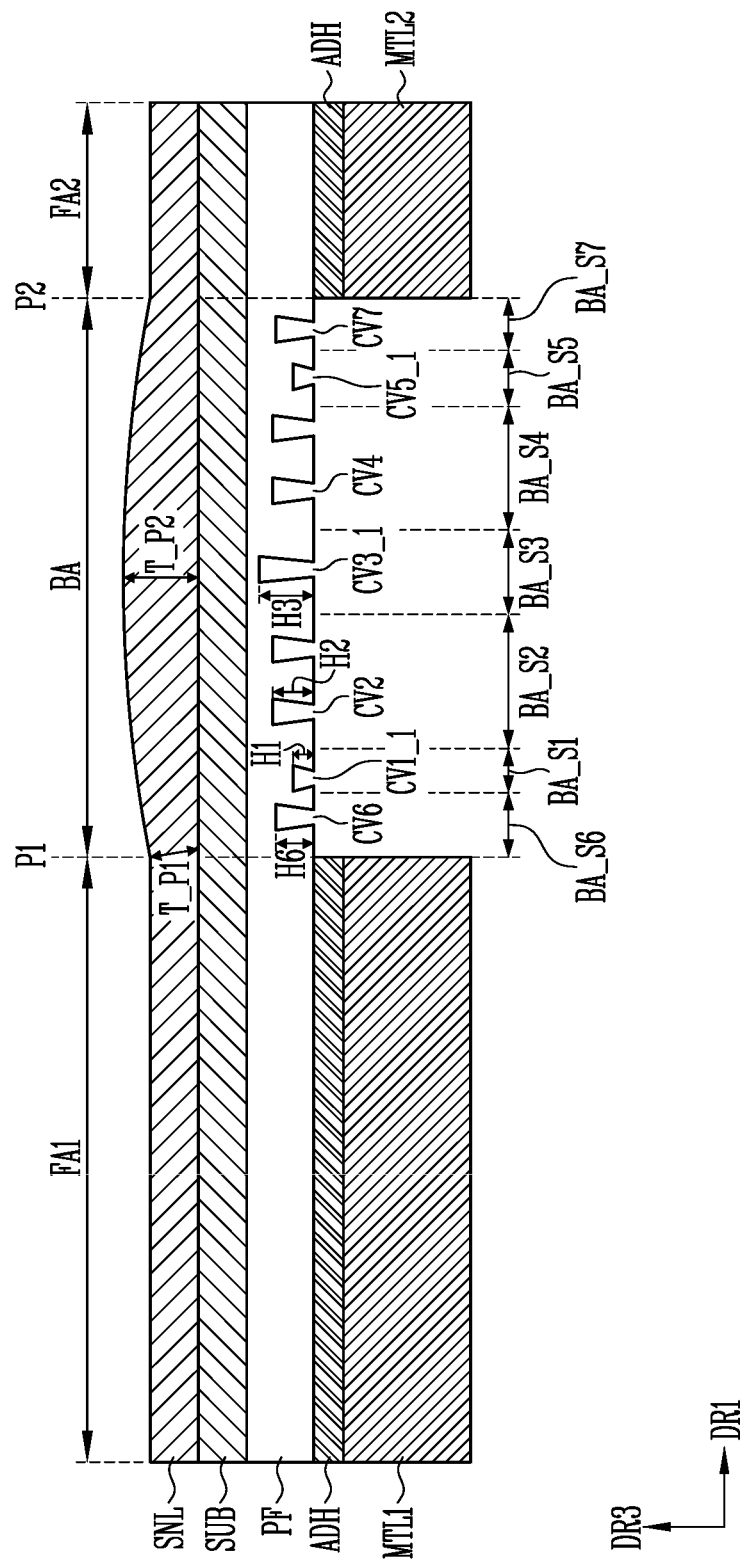
FIG. 12 is a sectional view illustrating an example of the display device of FIG. 11.
Figure 13:
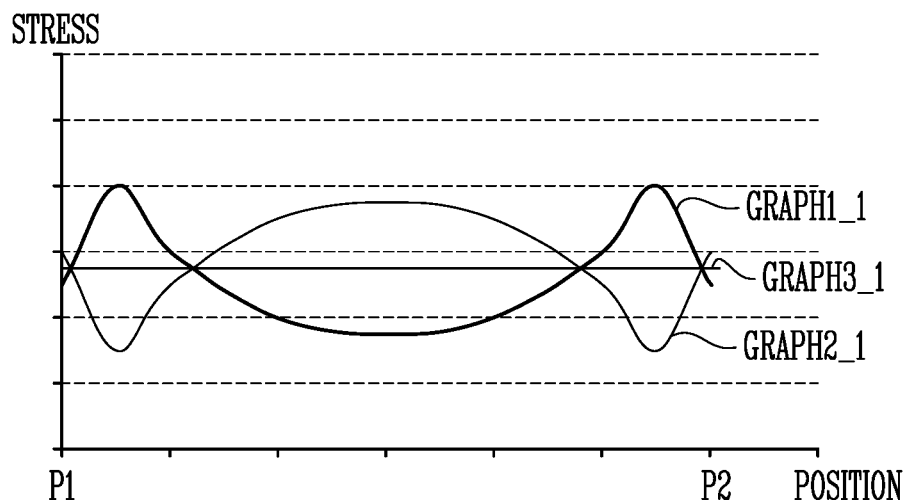
FIG. 13 is a diagram illustrating a stress of a bent region of the display device of FIG. 12.

FIG. 11 is a sectional view illustrating a further example of the display device of FIG. 1. FIG. 11 illustrates the section of the display device corresponding to the display device of FIG. 2. FIG. 12 is a sectional view illustrating an example of the display device of FIG. 11. FIG. 12 illustrates a state where the display device of FIG. 11 is unfolded. FIG. 13 is a diagram illustrating the stress of the bent region of the display device of FIG. 12. FIG. 13 illustrates the first to third graphs GRAPH1_1 to GRAPH3_1 corresponding to the first to third graphs GRAPH1 to GRAPH3 of FIG. 6.

Referring to FIGS. 2, 3, and 11-13, the thickness of the first passivation layer SNL included in the display device of FIG. 11 may vary for each position of the bent region BA. For example, the second thickness T_P2 of the first passivation layer SNL may be the largest at a central point or portion of the bent region BA. The thickness of the first passivation layer SNL may decrease in a direction toward the first point P1 (or toward the second point P2). The first thickness T_P1 of the first passivation layer SNL at the first point P1 may be the smallest. In other words, the modulus by the first passivation layer SNL may be the largest at the central point or central portion of the bent region BA, and the modulus by the first passivation layer SNL may be the smallest at the first point P1 (and/or at the second point P2).

In this case, as in the first graph GRAPH1_1 shown in FIG. 13, the stress of the substrate SUB may be the smallest at the central point of the bent region BA, and the stress of the substrate SUB may sharply increase at or near the first point P1 (and/or at or near the second point P2). The shape of the first graph GRAPH1_1 is due to an amount of stress compensation due to the first passivation layer SNL is reduced as the thickness of the first passivation layer SNL decreases in a direction toward the first and second points P1 and P2. The stress of the substrate SUB may be relatively small at the first point P1 (and at the second point P2) due to the first and second non-bent regions FA1 and FA2, which are respectively adjacent to the first and second points P1 and P2, being respectively supported by the first and second support members MTL1 and MTL2.

With respect to the third graph GRAPH3_1, the second graph GRAPH2_1 is set to be symmetrical to the first graph GRAPH1_1. Accordingly, the cavities CV1_1, CV2, CV3_1, CV4, CV5_1, CV6, and CV7 shown in FIGS. 11 and 12 may be determined.

The bent region BA shown in FIGS. 11 and 12 may be different from the bent region BA described with reference to FIGS. 2 and 3 in that the former further includes the sixth and seventh sub regions BA_S6 and BA_7.

The sixth sub region BA_S6 is set adjacent to the first point P1, and may correspond to a section extending from a point having the largest stress, as described with reference to FIG. 13, to the first point P1. Likewise, the seventh sub region BA_S7 is set adjacent to the second point P2, and may correspond to a section extending from a point having the largest stress, as described with reference to FIG. 13, to the second point P2. A total area of the sixth and seventh sub regions BA_S6 and BA_S7 may be smaller than a total area of the remaining sub regions.

In the first sub region BA_S1, the second passivation layer PF may include the first cavity CV1_1, and the first cavity CV1_1 may be similar to the third cavity CV3 described with reference to FIG. 3. Therefore, a duplicated description thereof will not be repeated herein. In the second sub region BA_S2, the second passivation layer PF may include the second cavity CV2, and the second cavity CV2 may be substantially equal or similar to the second cavity CV2 described with reference to FIG. 3. In the third sub region BA_S3, the second passivation layer PF may include the third cavity CV3_1, and the third cavity CV3_1 may be similar to the first cavity CV1 described with reference to FIG. 3. Based on the third sub region BA_S3, the fourth sub region BA_S4 may correspond to the second sub region BA_S2, and the fifth sub region BA_S5 may correspond to the first sub region BA_S1.

In the sixth sub region BA_S6, the second passivation layer PF may include the sixth cavity CV6. In the seventh sub region BA_S7, the second passivation layer PF may include the seventh cavity CV7.

The sixth and seventh cavities CV6 and CV7 may be substantially equivalent to or similar to the second cavity CV2. For example, the depth H6 of the sixth cavity CV6 may be equal or similar to the second depth H2 of the second cavity CV2, and a density of a plurality of sixth cavities CV6 in the sixth sub region BA_S6 (e.g., a number of sixth cavities CV6 per unit area in the sixth sub region BA_S6) may be equal or similar to a density of a plurality of second cavities CV2 (e.g., a number of second cavities CV2 per unit area) in the second sub region BA_S2.

As described with reference to FIGS. 11 to 13, even when the thickness of the first passivation layer SNL varies for each position of the bent region BA, the cavities of the second passivation layer PF may have different densities and/or sizes to correspond to the stress for each position of the substrate SUB.

Figure 14:
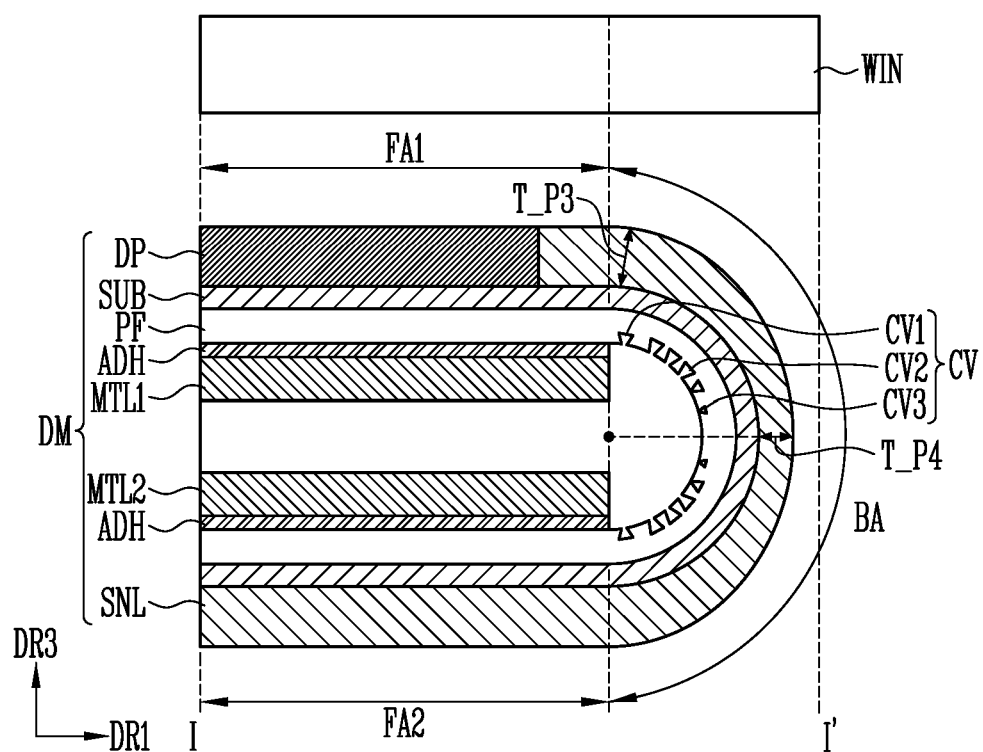
FIG. 14 is a sectional view illustrating a further example of the display device of FIG. 1.
Figure 15:
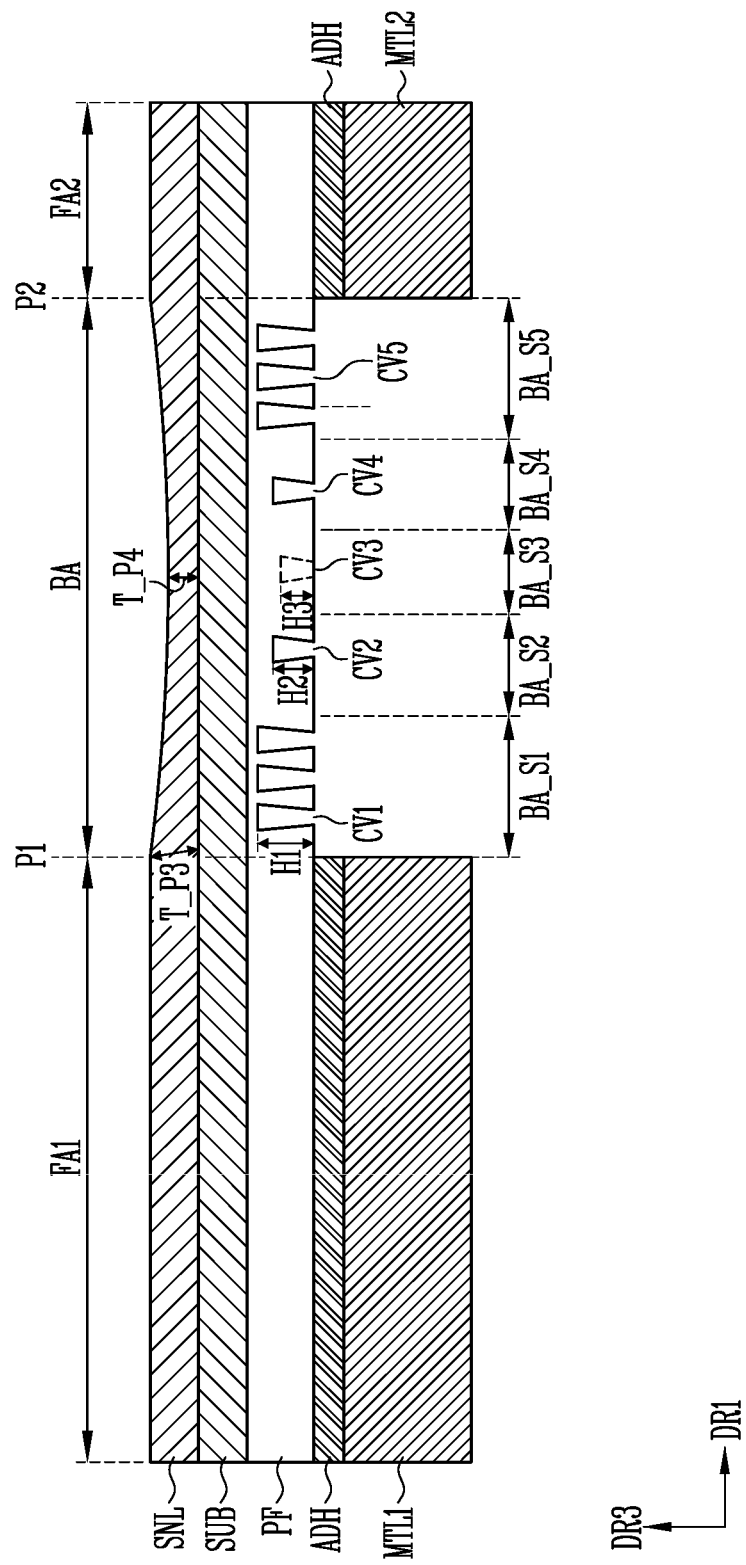
FIG. 15 is a sectional view illustrating an example of the display device of FIG. 14.
Figure 16:
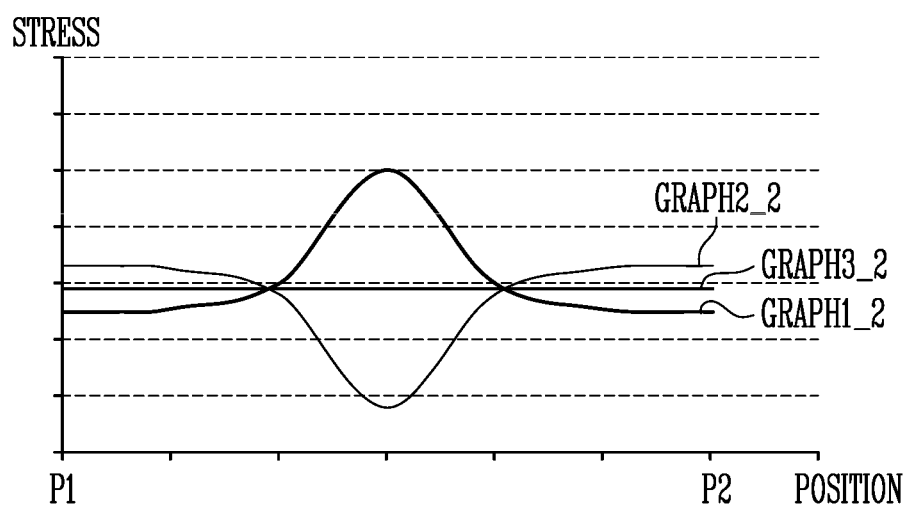
FIG. 16 is a diagram illustrating a stress of a bent region of the display device of FIG. 15.

FIG. 14 is a sectional view illustrating a further example of the display device of FIG. 1. FIG. 14 illustrates the section of the display device corresponding to the display device of FIG. 2. FIG. 15 is a sectional view illustrating an example of the display device of FIG. 14. FIG. 15 illustrates a state where the display device of FIG. 14 is unfolded. FIG. 16 is a diagram illustrating the stress of the bent region of the display device of FIG. 15. FIG. 16 illustrates the first to third graphs GRAPH1_2 to GRAPH3_2 corresponding to the first to third graphs GRAPH1 to GRAPH3 of FIG. 6.

Referring to FIGS. 2, 3, and 14-16, the thickness of the first passivation layer SNL included in the display device of FIG. 11 may vary for each position of the bent region BA. For example, the second thickness T_P4 of the first passivation layer SNL may be the smallest at or near the central point of the bent region BA. The thickness of the first passivation layer SNL may increase in a direction toward the first point P1 (or toward the second point P2). The first thickness T_P3 of the first passivation layer SNL at the first point P1 may be the largest. In other words, the modulus by the first passivation layer SNL may be the smallest at the first point P1 (and at the second point P2), while the modulus by the first passivation layer SNL may be the largest at or near the central point.

In this case, as in the first graph GRAPH1_2 shown in FIG. 16, the stress of the substrate SUB may be the largest at or near the central point of the bent region BA, and the stress of the substrate SUB may be sharply reduced at the first point P1 (and at the second point P2). The shape of the first graph GRAPH1_2 is due to the thickness of the first passivation layer SNL generally increasing in a direction toward the first and second points P1 and P2. The stress of the substrate SUB may be the smallest at or near the first point P1 (and at or near the second point P2).

With respect to the third graph GRAPH3_2, the second graph GRAPH2_2 is symmetrical to the first graph GRAPH1_2. Accordingly, relevant features of the cavities CV1 to CV5 shown in FIGS. 11 and 12 may be determined.

The first to fifth sub regions BA_S1 to BA_S5 described with reference to FIG. 12 may be similar to the first to fifth sub regions BA_S1 to BA_S5 described with reference to FIG. 3, except for, for example, corresponding widths (or area, size, etc.).

For example, based on the first to fifth sub regions BA_S1 to BA_S5 described with reference to FIG. 3, the width of the third sub region BA_S3 shown in FIG. 15 may be relatively smaller, and the width of the first sub region BA_S1 shown in FIG. 15 may be relatively larger, in accordance with the stress depicted by the second graph GRAPH2_2. For example, as shown in FIG. 15, the width of the third sub region BA_S3 may be smaller than the width of each of the first, second, fourth and fifth sub regions BA_S1, BA_S2, BA_S4, and BA_S5.

Furthermore, the first to fifth cavities CV1 to CV5 included in the first to fifth sub regions BA_S1 to BA_S5 described with reference to FIG. 15 may be substantially equal or similar to the first to fifth cavities CV1 to CV5 described with reference to FIG. 3. Therefore, a duplicated description thereof will not be repeated herein.

The third sub region BA_S3 may or may not include the third cavity CV3. In this case, the stress caused by the thickness reduction of the first passivation layer SNL may be further compensated for at or near the central point of the bent region BA.

As described with reference to FIGS. 14 to 16, even when the thickness of the first passivation layer SNL is the largest in the boundary region between the bent region BA and the first and second non-bent regions FA1 and FA2, the cavities CV1 to CV5 of the second passivation layer PF may have different densities and/or sizes in response to the corresponding stress for each position of the substrate SUB.

A display device according to embodiments of the present disclosure includes a passivation film that is located on a surface of a substrate, and that includes a cavity, or plurality of cavities, having a density corresponding to a stress for each position of a bent region, so that the curvature of the bent region can be made uniform, and so that the strength of the bent region can be improved.

The scope of the present disclosure is not limited by detailed descriptions of the present specification, and should be defined by the accompanying claims. Furthermore, all changes or modifications of the present disclosure derived from the meanings and scope of the claims, and equivalents thereof should be construed as being included in the scope of the present disclosure.

What is claimed is:

1. A display device comprising:
    a substrate comprising a first flat region and a second flat region spaced apart from each other, and a bendable region between the first flat region and the second flat region;
    a display layer on a first surface of the substrate in the first flat region, and configured to display an image;
    a first passivation layer on the first surface of the substrate in the bendable region;
    a second passivation layer on a second surface of the substrate, the second passivation layer defining cavities spaced apart from each other in the bendable region; and
    support members on the second surface of the substrate in the first flat region and the second flat region,
    wherein a first density of first cavities of the cavities corresponding to a first area in, and at a center area of, the bendable region is less than an average density of the cavities, and is less than a density of second cavities of the cavities corresponding to an edge of the bendable region,
    wherein a bending stress of the substrate corresponding to the first area is greater than a concurrent average bending stress of the substrate in the bendable region,
    wherein a depth of the second cavities is greater than a depth of the first cavities,
    wherein the bendable region comprises a first adjacent region that is adjacent to the first flat region, a second adjacent region that is adjacent to the second flat region, and an intermediate region between the first adjacent region and the second adjacent region, and
    wherein a first thickness of the first passivation layer at the first adjacent region is greater than a second thickness of the first passivation layer at the intermediate region.

2. The display device according to claim 1, wherein a thickness of the first passivation layer is constant throughout the bendable region, and
    wherein the bending stress of the substrate increases, and the first density of the cavities decreases, in the first area in a direction away from the first flat region to the center area of the bendable region.

3. The display device according to claim 2,
    wherein a bending stress of the substrate in the first adjacent region is less than the concurrent average bending stress of the substrate in the bendable region, wherein a bending stress of the substrate in the intermediate region is greater than the concurrent average bending stress of the substrate in the bendable region, and wherein a density of the first cavities in the first adjacent region is greater than a density of the second cavities in the intermediate region.

4. The display device according to claim 1, wherein a number of the first cavities in a unit area is equal to a number of the second cavities in the unit area.

5. The display device according to claim 3, wherein an average diameter, an average width, or an average area of the first cavities is greater than an average diameter, an average width, or an average area of the second cavities.

6. The display device according to claim 1, wherein each of the cavities has a planar shape of a circle or tetragon, and
wherein the cavities are arranged in a staggered manner along a direction in which the first flat region and the second flat region are spaced apart from each other.

7. The display device according to claim 1, wherein each of the cavities has a bar-shaped planar shape, and extends in a direction perpendicular to the direction in which the first flat region and the second flat region are spaced apart from each other.

8. A display device comprising:
a substrate comprising a first flat region and a second flat region spaced apart from each other, and a bendable region between the first flat region and the second flat region;
a display layer on a first surface of the substrate in the first flat region, and configured to display an image;
a first passivation layer on the first surface of the substrate in the bendable region;
a second passivation layer on a second surface of the substrate, the second passivation layer defining cavities spaced apart from each other in the bendable region; and
support members on the second surface of the substrate in the first flat region and the second flat region,
wherein the bendable region comprises a first adjacent region that is adjacent to the first flat region, a second adjacent region that is adjacent to the second flat region, and an intermediate region between the first adjacent region and the second adjacent region,
wherein a first thickness of the first passivation layer at the first adjacent region is less than a second thickness of the first passivation layer at the intermediate region, and
wherein a density of first cavities of the second passivation layer at the first adjacent region is less than a density of second cavities of the second passivation layer at the intermediate region.

9. The display device according to claim 8, wherein an area of the intermediate region is greater than a total area of the first adjacent region and the second adjacent region.

10. The display device according to claim 9, wherein the density of the cavities in the intermediate region decreases in a direction toward the first adjacent region, and
wherein the density of the cavities in the first adjacent region increases in a direction toward the first flat region.

11. The display device according to claim 1, wherein a bending stress of the substrate in the first adjacent region is less than the concurrent average bending stress of the substrate,
wherein a bending stress of the substrate in the intermediate region is greater than the concurrent average bending stress of the substrate, and
wherein an area of the intermediate region is less than an area of the first adjacent region, and is less than an area of the second adjacent region.

12. The display device according to claim 11, wherein the density of the cavities in the intermediate region increases in a direction toward the first adjacent region, and
wherein the density of the cavities in the first adjacent region is constant.

13. A display device comprising:
a substrate comprising a first flat region and a second flat region spaced apart from each other, and a bendable region between the first flat region and the second flat region;
a display layer on a first surface of the substrate in the first flat region, and configured to display an image;
a first passivation layer on the first surface of the substrate in the bendable region;
a second passivation layer on a second surface of the substrate in the bendable region, and comprising cavities that are spaced apart from each other; and
support members on the second surface of the substrate in the first flat region and the second flat region,
wherein a first depth of first cavities of the cavities at a first area is less than an average depth of the cavities,
wherein a bending stress of the substrate corresponding to the first area of the bendable region is greater than a concurrent average bending stress of the bendable region,
wherein the bendable region comprises a first adjacent region that is adjacent to the first flat region, a second adjacent region that is adjacent to the second flat region, and an intermediate region between the first adjacent region and the second adjacent region, and
wherein a first thickness of the first passivation layer at the first adjacent region is greater than a second thickness of the first passivation layer at the intermediate region.

* * * * *